United States Patent
Nagata

(10) Patent No.: US 8,319,305 B2
(45) Date of Patent: Nov. 27, 2012

(54) SOLID-STATE IMAGE SENSING APPARATUS

(75) Inventor: Keiji Nagata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/255,935

(22) PCT Filed: Mar. 31, 2010

(86) PCT No.: PCT/JP2010/056276
§ 371 (c)(1),
(2), (4) Date: Sep. 12, 2011

(87) PCT Pub. No.: WO2010/131534
PCT Pub. Date: Nov. 18, 2010

(65) Prior Publication Data
US 2012/0043636 A1  Feb. 23, 2012

(30) Foreign Application Priority Data
May 12, 2009  (JP) ................. 2009-115919

(51) Int. Cl.
*H01L 27/146* (2006.01)
*H01L 31/06* (2012.01)
*H01L 31/062* (2012.01)
*H01L 29/66* (2006.01)
*H01L 31/101* (2006.01)

(52) U.S. Cl. ........ 257/435; 257/461; 257/292; 257/132; 257/462

(58) Field of Classification Search .......... 257/292, 257/294, 462, E31.122; 358/513, 482
See application file for complete search history.

(56) References Cited

U.S. PATENT DOCUMENTS

| | | | |
|---|---|---|---|
| 6,169,319 B1 * | 1/2001 | Malinovich et al. | 257/447 |
| 7,382,011 B2 * | 6/2008 | Noda et al. | 257/292 |
| 2007/0041062 A1 | 2/2007 | Chinnaveerappan et al. | |
| 2007/0290245 A1 * | 12/2007 | Unagami et al. | 257/294 |
| 2008/0006896 A1 * | 1/2008 | Nakashiba | 257/462 |

(Continued)

FOREIGN PATENT DOCUMENTS

JP   2002-290841 A   10/2002

(Continued)

OTHER PUBLICATIONS

Machine Translation of Ezaki, Japanese JP 2005347708, published Dec. 2005, translated on Feb. 29, 2012.*

*Primary Examiner* — Ha Tran T Nguyen
*Assistant Examiner* — Dzung Tran
(74) *Attorney, Agent, or Firm* — Cowan, Liebowitz & Latman, P.C.

(57) ABSTRACT

This invention provides a solid-state image sensing apparatus in which a sensor portion that performs photo-electric conversion and plural layers of wiring lines including a signal line for the sensor portion are formed on a semiconductor substrate; which includes an effective pixel portion configured such that light enters the sensor portion, and an optical black portion shielded so that the light does not enter the sensor portion; and which has a light-receiving surface on the back surface side of the semiconductor substrate. The optical black portion includes the sensor portion, a first light-shielding film formed closer to the back surface side of the semiconductor substrate than the sensor portion, and a second light-shielding film formed closer to the front surface side of the semiconductor substrate than the sensor portion.

6 Claims, 2 Drawing Sheets

U.S. PATENT DOCUMENTS

| | | | |
|---|---|---|---|
| 2008/0105908 A1* | 5/2008 | Lee | 257/290 |
| 2009/0108312 A1* | 4/2009 | Kim et al. | 257/294 |
| 2009/0295979 A1* | 12/2009 | Matsuo et al. | 348/335 |

FOREIGN PATENT DOCUMENTS

| | | |
|---|---|---|
| JP | 2005-347708 A | 12/2005 |
| JP | 2006-120805 A | 5/2006 |
| JP | 2007-305675 A | 11/2007 |
| JP | 2008-016733 A | 1/2008 |
| JP | 2009-505437 A | 2/2009 |
| JP | 2009-259934 A | 11/2009 |

* cited by examiner

SOLID-STATE IMAGE SENSING APPARATUS

CROSS-REFERENCE TO RELATED APPLICATIONS

This application is a national stage application of International Application No. PCT/JP2010/056276, filed Mar. 31, 2010, whose benefit is claimed and which claims the benefit of Japanese Patent Application No. 2009-115919, filed May 12, 2009, the entire disclosures of which are incorporated herein by reference.

TECHNICAL FIELD

The present invention relates to the structure of a solid-state image sensing apparatus.

BACKGROUND ART

Japanese Patent Laid-Open No. 2007-305675 discloses a technique for reducing an influence that infrared light exerts on an optical black portion (to be referred to as an OB portion hereinafter). Also, Japanese Patent Laid-Open No. 2008-016733 discloses a technique for preventing the adverse effect of light which enters an effective pixel portion from the front surface side of a semiconductor substrate in a back surface incidence type solid-state image sensing apparatus.

Although infrared light can be shielded by a light-shielding film, it is harder to absorb than visible light and therefore has a penetration distance longer than that of visible light. For this reason, infrared light which obliquely enters the effective pixel portion on the light-receiving surface is transmitted through the semiconductor substrate, is reflected by the surface opposite to the light-receiving surface, and enters a sensor portion in the OB portion. In this case, photo-electric conversion occurs in the OB portion, so a black level to be detected in the OB portion under normal circumstances may not be correctly detected.

Also, to improve the aperture ratio, another back surface incidence type solid-state image sensing apparatus has been proposed. In this apparatus, a sensor portion which performs photo-electric conversion and plural layers of wiring lines including a signal line for driving the sensor portion are formed on the front surface side of a semiconductor substrate. This apparatus has a light-receiving surface on the back surface side of the semiconductor substrate. However, this structure poses a problem that infrared light enters the OB portion in relatively large amounts although it can improve the aperture ratio.

FIG. 4 is a sectional view showing the schematic arrangement of a conventional back surface incidence type solid-state image sensing element. A light-shielding film 30 for shielding an OB portion is formed above a sensor portion 11 and opens to an effective pixel portion 41 of a pixel within the effective pixel portion 41, as shown in FIG. 4. Infrared light strikes the light-receiving surface of a semiconductor substrate 10. Then, it is often the case that infrared light L which obliquely strikes the semiconductor substrate 10 is transmitted through the semiconductor substrate 10, is reflected by the inner surface of an insulating layer 20 on the side opposite to the light-receiving surface, and enters the sensor portion 11 of a pixel within an OB portion 42, as shown in FIG. 4.

Infrared light is harder to absorb than visible light, but is absorbed albeit poorly. Especially infrared light with a wavelength of about 800 nm to 1,300 nm is absorbed by silicon to some extent. For this reason, when infrared light enters the sensor portion 11 of a pixel within the OB portion 42, it is absorbed by the sensor portion 11 and photo-electric conversion occurs in the OB portion 42.

As a measure against the above-mentioned phenomenon, it is possible to form an image sensing apparatus such as a camera by placing an IR cut filter in front of a solid-state image sensing element. Using an IR cut filter in this way makes it possible to prevent infrared light from entering not only the OB portion but also the effective pixel portion. However, an IR cut filter capable of cutting light in a wide wavelength range is very expensive, so its use raises the cost of the image sensing apparatus. Furthermore, the measure of using an IR ct filter cannot be adopted in, for example, an image sensing apparatus which cannot employ an IR cut filter (for example, a monitoring camera which utilizes infrared light or an image sensing apparatus which enhances the resolution by utilizing infrared light).

SUMMARY OF INVENTION

The present invention has been made in consideration of the above-mentioned problems, and prevents infrared light from entering an optical black portion.

According to the present invention, there is provided a solid-state image sensing apparatus in which a sensor portion that performs photo-electric conversion is formed on a semiconductor substrate; which includes an effective pixel portion configured such that light enters the sensor portion, and an optical black portion shielded so that the light does not enter the sensor portion; and which has a light-receiving surface on a back surface side of the semiconductor substrate, wherein the optical black portion comprises the sensor portion, a first light-shielding film formed closer to the back surface side of the semiconductor substrate than the sensor portion, and a second light-shielding film formed closer to a front surface side of the semiconductor substrate than the sensor portion.

Also, according to the present invention, there is provided a solid-state image sensing apparatus in which a sensor portion that performs photo-electric conversion is formed on a semiconductor substrate; which includes an effective pixel portion configured such that light enters the sensor portion, and an optical black portion shielded so that the light does not enter the sensor portion; and which has a light-receiving surface on a back surface side of the semiconductor substrate, wherein the optical black portion comprises the sensor portion, a light-shielding film formed closer to the back surface side of the semiconductor substrate than the sensor portion, and plural layers of wiring lines formed closer to a front surface side of the semiconductor substrate than the sensor portion, and the plural layers of the wiring lines are formed so as to shield the light which enters the sensor portion.

Further features of the present invention will become apparent from the following description of exemplary embodiments with reference to the attached drawings.

DESCRIPTION OF EMBODIMENTS

Figure 1:
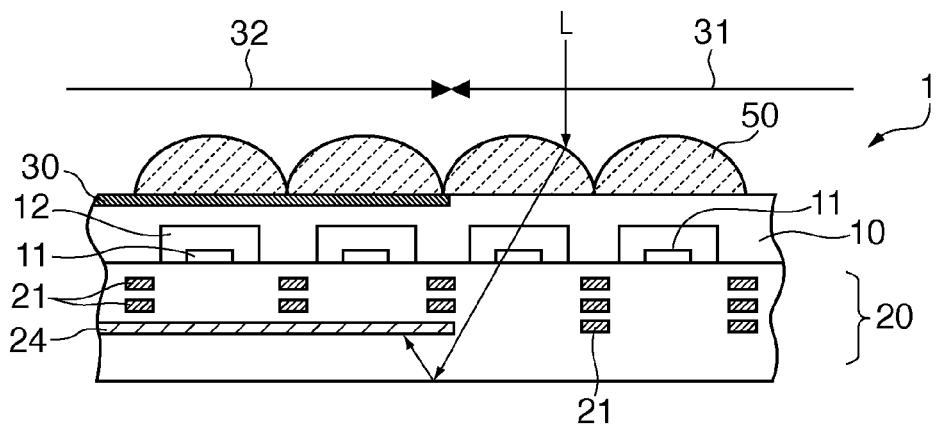
FIG. 1 is a sectional view showing the structure of a solid-state image sensing apparatus according to the first embodiment of the present invention.

Embodiments of the present invention will be described in detail below with reference to the accompanying drawings. Note that the same reference numerals denote the same elements throughout the drawings, and a repetitive description thereof will not be given.

(First Embodiment)

FIG. 1 is a sectional view showing the structure of a solid-state image sensing apparatus according to the first embodiment of the present invention. A solid-state image sensing apparatus 1 in this embodiment is of the CMOS type. In this embodiment, a semiconductor substrate (silicon substrate) 10 includes P-type well regions 12, and sensor portions 11 which perform photo-electric conversion are formed in the P-type well regions 12. The sensor portion 11 is formed from an N-type impurity diffusion layer (first impurity diffusion layer) and forms a PN-junction diode with the semiconductor substrate 10. The sensor portions 11 of respective pixels are isolated from each other by an element isolation layer (not shown) formed from a SiO$_2$ layer, which is partially buried in the semiconductor substrate 10. An insulating layer 20 is formed on the front surface side of the semiconductor substrate 10, i.e., below the sensor portions 11. Plural layers of wiring lines 21 including a signal line for the sensor portion 11 are formed within the insulating layer 20.

The solid-state image sensing apparatus 1 is of the back surface incidence type and senses an object by photo-electrically converting, by the sensor portion 11, light which comes from the object upon striking the back surface (light-receiving surface) of the semiconductor substrate 10. A large number of pixels are formed in the pixel region. The pixel region includes an effective pixel portion 31 and optical black (OB) portion 32. The effective pixel portion 31 serves to obtain an image signal by guiding the light to the sensor portion 11 and photo-electrically converting it. The optical black portion 32 is shielded to prevent the light from entering the sensor portion 11 in order to obtain the black level standard of the image signal. Although not shown, the effective pixel portion 31 serves as the main part of the pixel region and the optical black portion 32 is formed on the edge of the pixel region.

A light-shielding film 30 (first light-shielding film) for shielding the optical black portion 32 to prevent the light from entering the sensor portion 11 is formed on the back surface side (light-receiving surface side) of the semiconductor substrate 10 in the optical black portion 32 for detecting a black level. On-chip lenses 50 are formed on the light-shielding film 30 on the back surface side (light-receiving surface side) of the semiconductor substrate 10. If the solid-state image sensing element in this embodiment is used as a color solid-state image sensing element, color filters (not shown) are placed below the on-chip lenses 50. Note that each pixel includes a transistor portion including a transistor which is formed in a portion other than the cross-section shown in FIG. 1 and serves to read out a signal charge photo-electrically converted by the sensor portion 11 and to convert the signal charge into a voltage and extract it as a signal.

In this embodiment, a light-shielding film (second light-shielding film) is formed within the insulating layer 20 present on the front surface side of the semiconductor substrate 10 in the optical black portion 32. The plural layers of the wiring lines 21 including a signal line for the sensor portion 11 are formed within the insulating layer 20 present below the semiconductor substrate 10 (on its front surface side). One of the layers of the wiring lines 21 simultaneously serves as the light-shielding film 24 mentioned above. The light-shielding film 24 is made of the same material as that of the wiring lines 21. Examples of this material are aluminum (Al), copper (Cu), tungsten (W), and titanium (Ti).

An effect produced by forming a solid-state image sensing apparatus 1 as in this embodiment will be explained next. On the front surface side of the solid-state image sensing apparatus 1 in the OB portion, the light-shielding film 24 as mentioned above is formed within the insulating layer 20 present on the front surface side of the semiconductor substrate 10. This makes it possible to prevent infrared light which comes from the region, where the light-shielding film 30 is absent, on the back surface side of the semiconductor substrate 10 in the effective pixel portion, is transmitted through the semiconductor substrate 10, and is reflected by the inner surface, on the front surface side, of the insulating layer 20 present on the front surface side of the semiconductor substrate 10, from entering the sensor portion 11 in the optical black portion 32. This, in turn, makes it possible to correctly detect a black level in the optical black portion 32, thus obtaining a satisfactory sensed image.

In this manner, the light-shielding film 24 is formed only inside the optical black portion. Hence, infrared reaches the inner surface, on the front surface side, of the insulating layer 20 below the semiconductor substrate 10 without being reflected by the light-shielding film 24 and becoming stray light. In addition, even when the infrared light reflected by the inner surface enters the optical black portion 32, it is shielded by the light-shielding film 24 formed within the insulating layer 20 including the wiring line layers and is therefore prevented from entering the sensor portion 11 in the optical black portion 32. In this embodiment, the light-shielding film 24 is formed within the insulating layer 20 and made of the same material as that of the wiring lines 21. This makes it possible to form the light-shielding film 24 in the wiring line forming process, thus facilitating the formation of the light-shielding film 24 and, in turn, the manufacture of the solid-state image sensing apparatus 1.

Japanese Patent Laid-Open No. 2007-305675 uses a measure of forming a low reflecting coating at the interface of the semiconductor substrate against a problem that infrared light which comes from the aperture region is reflected by the inner surface at the interface of the semiconductor substrate and enters the optical black portion. It is possible to utilize this measure for a back surface incidence type solid-state image sensing apparatus. Nevertheless, a back surface incidence type solid-state image sensing apparatus has a relatively high aperture ratio, so infrared light is prone to enter the optical black portion with a relatively high intensity in relatively large amounts. The measure of using a low reflecting coating in Japanese Patent Laid-Open No. 2007-305675 cannot perfectly prevent the reflection only by reducing the chance of the reflection. Furthermore, because the optical thickness of the low reflecting coating for suppressing the reflection is constant, a satisfactory effect cannot be obtained for infrared light in a wide wavelength range.

Also, Japanese Patent Laid-Open No. 2008-016733 proposes a measure of forming a light-shielding film on the front surface side of the semiconductor substrate to cover the entire light-receiving portion to prevent the adverse effect of light which externally enters the back surface incidence type solid-state image sensing apparatus. However, with the measure proposed in Japanese Patent Laid-Open No. 2008-016733, a satisfactory effect cannot be obtained for light which comes from the light-receiving surface side, is transmitted through the semiconductor substrate, is reflected by the surface opposite to the light-receiving surface, and enters the sensor portion although this is a problem to be solved by the present invention. Furthermore, when the light-shielding film is made of the same material as that of the wiring line layers, the above-mentioned measure may even increase the chance of reflection and contribute to the entrance of infrared light to the optical black portion.

(Second Embodiment)

Figure 2A:
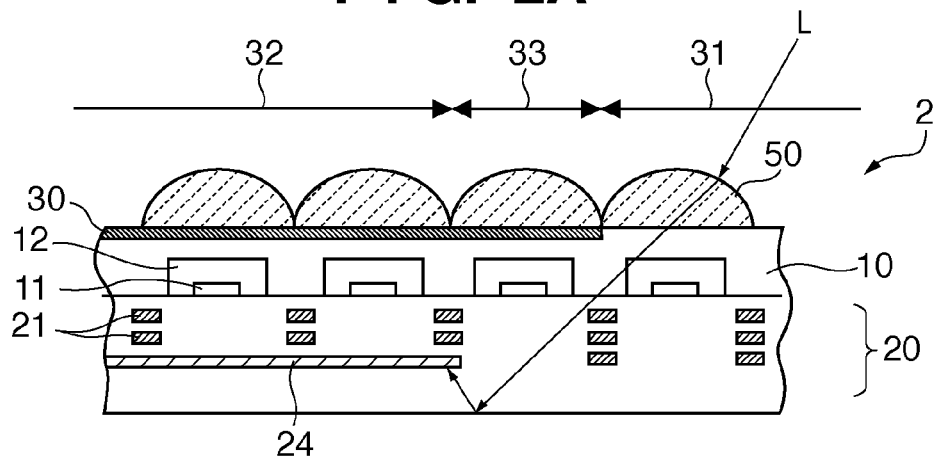
FIGS. 2A and 2B are sectional views showing the structure of a solid-state image sensing apparatus according to the second embodiment of the present invention.

FIG. 2A is a sectional view showing the structure of a solid-state image sensing apparatus according to the second embodiment of the present invention. In a solid-state image sensing apparatus 2 in this embodiment, a light-shielding dummy pixel portion 33 is formed at the boundary between an effective pixel portion 31 and an optical black portion 32. Also, a light-shielding film 24 is formed inside the light-shielding region on a light-shielding film 30. That is, the light-shielding region on the light-shielding film 24 is narrower than that on the light-shielding film 30, so a region in which the sensor portion 11 is shielded by the light shielding film 30 and the sensor portion 11 is not shielded by the light-shielding film 24 is the light-shielding dummy pixel portion 33. Other arrangements and operations of the solid-state image sensing apparatus 2 are the same as the solid-state image sensing apparatus 1.

Figure 2B:
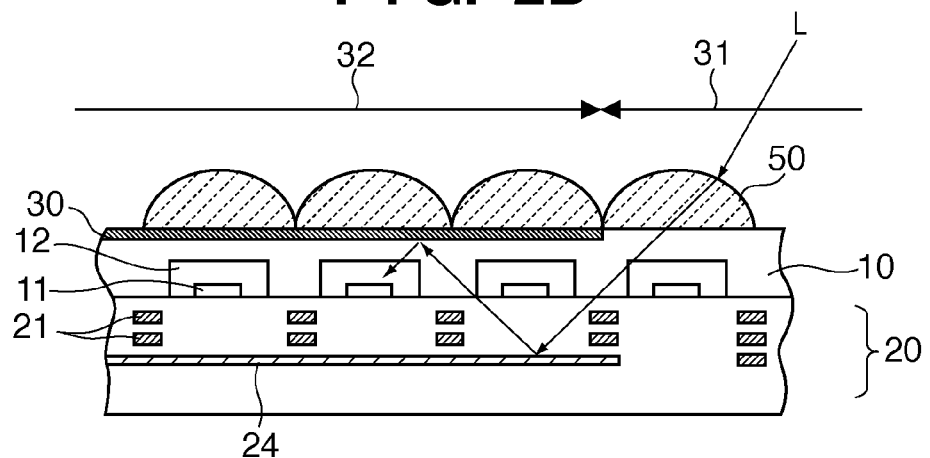

FIG. 2B is a sectional view illustrating a case in which the light-shielding film 24 is not formed inside the light-shielding region on the light-shielding film 30 which forms the optical black portion 32, for the sake of comparison with the arrangement shown in FIG. 2A. In the arrangement shown in FIG. 2B, infrared light which enters the edge of the effective pixel portion 31 may be reflected by the surface, on the back surface side (light-receiving surface side), of the light-shielding film 24 without reaching the inner surface, on the front surface side, of an insulating layer 20 below a semiconductor substrate 10 and enter the sensor portion as stray light, depending on the incident angle of infrared light.

Hence, the structure as shown in FIG. 2A can prevent even light which enters the effective pixel portion 31 at a relatively large incident angle from directly entering the position between the light-shielding film 30 and the light-shielding film 24 and becoming stray light. This makes it possible to reliably shield the optical black portion 32. Although the light-shielding film 24 is formed inside the light-shielding region on the light-shielding film 30 at a length that is narrower than the light-shielding region by one pixel in this embodiment, it may be formed inside the light-shielding region at a length that is narrower than the light-shielding region by of more than one pixel. When, for example, a color filter (not shown) represents one set of colors using four, 2×2 pixels (the so-called Bayer array), the light-shielding film 24 may be formed inside the light-shielding region at a length that is narrower than the light-shielding region by two pixels for the sake of convenience of signal processing. Also, in an arrangement which reads out the signals output from the solid-state image sensing apparatus via a plurality of channels, the light-shielding film 24 may be formed inside the light-shielding region on the light-shielding film 30 at a length that is narrower than the light-shielding region by an integer multiple of the number of output channels in order to equalize signal processing in the OB portion among the output channels.

(Third Embodiment)

Figure 3:
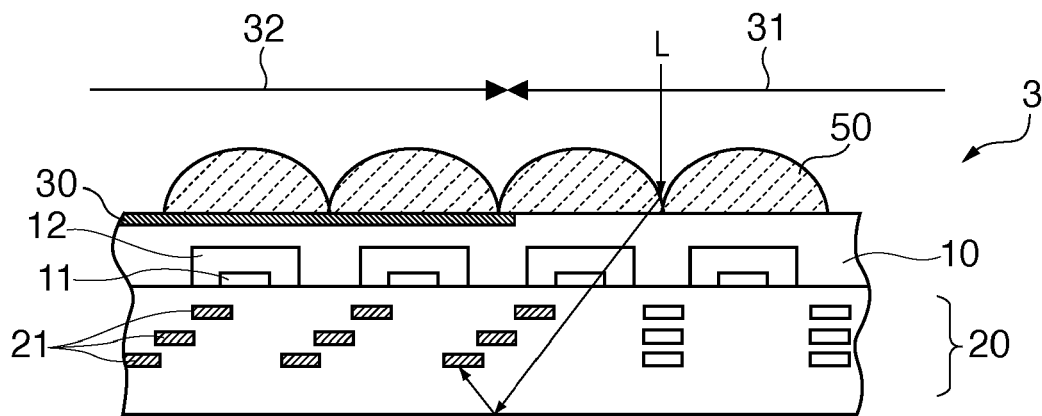
FIG. 3 is a sectional view showing the structure of a solid-state image sensing apparatus according to the third embodiment of the present invention.
Figure 4:
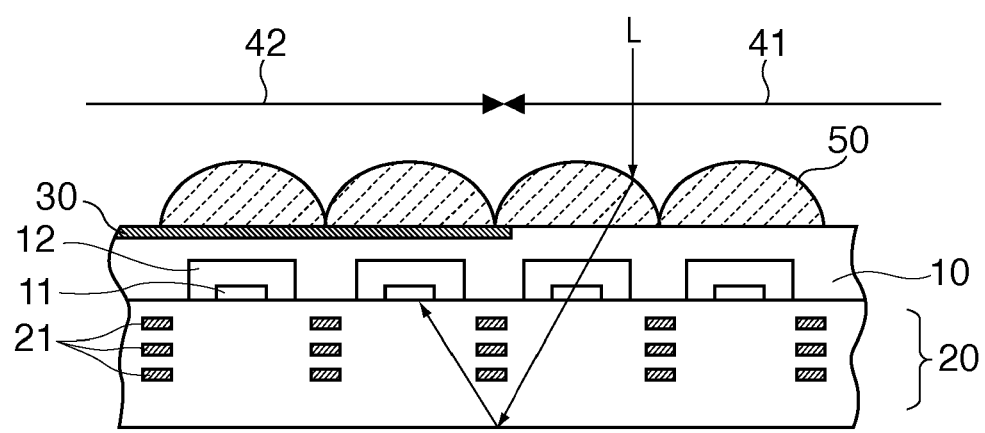
FIG. 4 is a sectional view showing the structure of a conventional solid-state image sensing apparatus.

FIG. 3 is a sectional view showing the structure of a solid-state image sensing apparatus according to the third embodiment of the present invention. In a solid-state image sensing apparatus 3, plural layers of wiring lines 21 simultaneously serve as a light-shielding film on the front surface side of a semiconductor substrate 10 in an optical black portion 32. Other arrangements and operations of the solid-state image sensing apparatus 3 are the same as in the solid-state image sensing apparatus 1.

If a light-shielding film is formed from a single wiring line layer, it has a wiring line shape largely different from that of an effective pixel portion 31, so differences in wiring line resistance and capacitance occur between the effective pixel portion 31 and the optical black portion 32. For this reason, problems such as difficulty of correctly detecting a black level may be posed due to the difference in electrical characteristic between the effective pixel portion 31 and the optical black portion 32. To overcome the problems, in this embodiment, the plural layers of the wiring lines 21 shield a sensor portion 11 in the optical black portion 32 against infrared reflected light (infrared light which comes from the effective pixel portion 31 and is reflected by the inner surface of the insulating layer 20 on the front surface side of the semiconductor substrate 10). This arrangement makes it possible to reduce or eliminate the difference in wiring line shape between the effective pixel portion 31 and the optical black portion 32, thereby matching their electrical characteristics. The use of the plural layers of the wiring lines 21 also makes it possible to generate a light-shielding directionality. For example, as for the entrance of light from the effective pixel portion 31 to the inner surface of the insulating layer 20 on the front surface side of the semiconductor substrate 10, the reflection area is set small by stacking a plurality of wiring lines in order to reduce components expected to become stray light upon being reflected by the wiring line layers. Also, as for the entrance of light from the front surface of an insulating layer 20 below the semiconductor substrate 10 to the optical black portion 32, an arrangement which shields light by setting the reflection area large can be adopted.

As has been explained above, according to the above-described embodiments, it is possible to shield infrared light which is reflected by the inner surface of the insulating layer 20 on the front surface side of a semiconductor substrate and enters a sensor portion in an optical black portion in a back surface incidence type solid-state image sensing apparatus. This, in turn, makes it possible to correctly determine a black level standard based on characteristics associated with the optical black portion. It is also possible to suppress the occurrence of problems such as coloring of an image to determine the black level and a change in brightness of the image. This, in turn, makes it possible to form a solid-state image sensing element with good image sensing characteristics.

Further, it is possible to reduce the cost of an IR cut filter of the image sensing apparatus or omit it. Also, a satisfactory image can be obtained by suppressing the occurrence of problems associated with reflected infrared light even in an image sensing apparatus which cannot employ an IR cut filter. Also, the number of steps never increases because a light-shielding film is formed using wiring line layers in the wiring line forming process.

The present invention is not limited to the above-described embodiments, and can be modified into various forms. For example, an effect of shielding infrared light from the effective pixel portion can be obtained even by forming the light-shielding film 24 only in the vicinity of the effective pixel portion in the OB portion. Also, although a P-type semiconductor substrate and an N-type light-receiving portion have been exemplified, an N-type semiconductor substrate and a P-type light-receiving portion may be adopted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-115919, filed May 12, 2009, and which is hereby incorporated by reference herein in its entirety.

The invention claimed is:

1. A solid-state image sensing apparatus in which a sensor portion that performs photo-electric conversion is formed in a semiconductor substrate; which includes an effective pixel portion configured such that light enters the sensor portion, and an optical black portion shielded so that the light does not enter the sensor portion; which has a light-receiving surface on a back surface side of the semiconductor substrate; and in which plural layers of wiring lines including a signal line for the sensor portion are formed on a front surface side of the semiconductor substrate, wherein the optical black portion comprises the sensor portion, a first light-shielding film formed closer to the back surface side of the semiconductor substrate than the sensor portion, and a second light-shielding film formed on a front surface side of the semiconductor substrate.

2. The apparatus according to claim 1, wherein said second light-shielding film is made of a material identical to a material of the wiring lines.

3. The apparatus according to claim 1, wherein said second light-shielding film shields light which comes from the effective pixel portion, is reflected by an inner surface of an insulating layer present on the front surface side of the semiconductor substrate, and travels toward the sensor portion in the optical black portion.

4. The apparatus according to claim 1, wherein a dummy pixel portion in which the sensor portion is shielded by said first light-shielding film on the back surface side of the semiconductor substrate and the sensor portion is not shielded by said second light-shielding film on the front surface side of the semiconductor substrate is formed at a boundary between the effective pixel portion and the optical black portion.

5. The apparatus according to claim 1, wherein the plural layers of the wiring lines are formed so as to shield the light which enters the sensor portion.

6. The apparatus according to claim 5, wherein the plural layers of the wiring lines shield light which comes from the effective pixel portion, is reflected by an inner surface of an insulating layer present on the front surface side of the semiconductor substrate, and travels toward the sensor portion in the optical black portion.

* * * * *